(12) United States Patent
Blanco Pacios et al.

(10) Patent No.: US 9,926,085 B2
(45) Date of Patent: Mar. 27, 2018

(54) METHOD FOR OPTIMIZING THE DESIGN OF MANHOLE OPENINGS ON AN AIRCRAFT

(71) Applicant: Airbus Operations S.L., Getafe, Madrid (ES)

(72) Inventors: Carlos Blanco Pacios, Valladolid (ES); Jose Luis Delgado Jareño, Leganés (ES)

(73) Assignee: AIRBUS OPERATIONS S.L., Madrid (ES)

( * ) Notice: Subject to any disclaimer, the term of this patent is extended or adjusted under 35 U.S.C. 154(b) by 1019 days.

(21) Appl. No.: 13/738,552

(22) Filed: Jan. 10, 2013

(65) Prior Publication Data

US 2013/0338973 A1 Dec. 19, 2013

(30) Foreign Application Priority Data

Jan. 10, 2012 (EP) .................................... 12382004

(51) Int. Cl.
*G06F 17/50* (2006.01)
*B64F 5/00* (2017.01)
(Continued)

(52) U.S. Cl.
CPC .............. *B64F 5/00* (2013.01); *B64C 1/1446* (2013.01); *B64D 37/005* (2013.01); *G06F 17/50* (2013.01)

(58) Field of Classification Search
None
See application file for complete search history.

(56) References Cited

U.S. PATENT DOCUMENTS 4,291,816 A * 9/1981 Lamoureux ............... B64C 3/34
220/243
4,440,407 A * 4/1984 Gagas ..................... E02D 29/14
277/644

(Continued)

FOREIGN PATENT DOCUMENTS

EP 12382004.5 1/2012

OTHER PUBLICATIONS

Hu, Liu, et al. "Implementation of a sketch based approach to conceptual aircraft design synthesis and modeling." Chinese Journal of Aeronautics 17.4 (2004): 207-214.*

(Continued)

*Primary Examiner* — Omar Fernandez Rivas
*Assistant Examiner* — Nithya J Moll
(74) *Attorney, Agent, or Firm* — Jenkins, Wilson, Taylor & Hunt, P.A.

(57) ABSTRACT

Method for optimising the design of sealing rings of internal manhole covers which close the manhole openings over the inner surface of the skin of an aircraft structure, the surface that is in contact with the inner surface of the skin being the optimized surface of said sealing rings, the method including dividing the outer contour and the inner contour of the optimised surface into n points; grouping into families $F_i$ the sealing rings of each manhole opening; generating the curves that are best adapted to the set of points taken for the outer contour and for the inner contour of each sealing ring for each one of the families $F_i$; generating a ruled surface among the curves generated for each one of the families $F_i$.

9 Claims, 3 Drawing Sheets

(51) Int. Cl.
*B64D 37/00* (2006.01)
*B64C 1/14* (2006.01)

(56) References Cited

U.S. PATENT DOCUMENTS

| | | | | |
|---|---|---|---|---|
| 6,695,320 | B2* | 2/2004 | Busby | B32B 27/04 |
| | | | | 277/651 |
| 6,994,489 | B1* | 2/2006 | Corr | E02D 29/14 |
| | | | | 137/371 |
| 7,216,459 | B1* | 5/2007 | Akkala | E02D 29/14 |
| | | | | 16/285 |
| 7,556,220 | B2* | 7/2009 | Schulz | B65D 90/10 |
| | | | | 244/119 |
| 2002/0135137 | A1 | 9/2002 | Hammi | |
| 2009/0166473 | A1* | 7/2009 | Zuniga Sagredo | B64C 3/34 |
| | | | | 244/129.4 |
| 2012/0098212 | A1* | 4/2012 | Bogiatzis | B64C 3/34 |
| | | | | 277/637 |

OTHER PUBLICATIONS

Gaskcadd Gasket Layout and Design Software. © 2010.*
European Search Report for Application No. EP 12 38 2004 dated Oct. 12, 2012.

* cited by examiner

| Opening 12 | min value max value step e) | Fi | min value min value step e) |
|---|---|---|---|
| B1 | 4.26 | F1 | 3.61 |
| B2 | 5.06 | F2 | 4.35 |
| B3 | 5.20 | | 4.26 |
| B4 | 3.81 | F3 | 2.64 |
| B5 | 3.88 | F5 | 2.57 |
| B6 | 3.91 | F5 | 2.52 |
| B7 | 6.58 | F6 | 2.14 |
| B8 | 4.11 | F7 | 2.95 |
| B9 | 6.55 | F8 | 5.47 |
| B10 | 6.62 | | 5.52 |
| B11 | 6.57 | | 5.81 |
| B12 | 5.01 | F2 | 4.17 |
| B13 | 5.01 | | 4.19 |
| B14 | 5.04 | | 4.16 |
| B15 | 5.07 | | 4.08 |
| B16 | 5.08 | | 4.01 |
| B17 | 5.07 | F9 | 3.94 |
| B18 | 5.10 | F10 | 3.88 |
| B19 | 3.56 | F11 | 2.36 |
| B20 | 3.54 | | 2.34 |
| B21 | 3.55 | | 2.30 |
| B24 | 5.24 | F12 | 3.54 |
| B25 | 5.32 | | 3.40 |
| B26 | 7.45 | F13 | 5.24 |
| B27 | 6.07 | F14 | 4.28 |
| B28 | 6.17 | | 4.09 |
| B29 | 5.28 | F15 | 2.81 |

FIG. 5

METHOD FOR OPTIMIZING THE DESIGN OF MANHOLE OPENINGS ON AN AIRCRAFT

CROSS-REFERENCE TO RELATED APPLICATION

This U.S. non-provisional patent application claims priority to European Patent Application No. 12382004.5 filed on Jan. 10, 2012, the entire content of which is hereby incorporated by reference herein.

FIELD OF THE INVENTION

The present invention refers to the optimization of aircraft manhole openings and specifically, the optimization of the design of the rings for making an airtight seal of the inner manhole covers that close said manhole openings over the inner skin of the aircraft structure.

BACKGROUND OF THE INVENTION

The openings on the aircraft skin are normally identified by the term manhole openings, whereas the covers of these openings are called manhole covers or doors for manhole openings. Thus manhole openings and manhole covers in aircraft are commonplace and are necessary both for assembly and the subsequent inspections and maintenance tasks throughout the life of the aircraft.

In the specific case of fuel tank inlets on aeronautic structures, aircraft wings and stabilisers, this access is usually carried out through manhole openings which, furthermore, must comply with several requirements:

- The size of the manhole opening must be in accordance with the accessibility requirements
- The door or manhole cover must be sealed so as to prevent fuel loss
- They must be in compliance with impact requirements
- Assembly and disassembly of doors or manhole covers must be as quick and easy as possible
- The doors or manhole covers must be interchangeable One of the known solutions for aircraft manhole openings employs an opening having adequate dimensions, in which two separate manhole covers or doors are installed, one manhole cover located inside the fuel tank and a second manhole cover on the exterior aerodynamic surface of the aircraft, both manhole covers screwed together in such a way that they hold the panel of the skin of the aircraft between them. To maintain the outer aerodynamic surface, a cavity is machined on the outer face of the skin which will be used for the installation of the outer manhole cover. At the same time, a sealing ring is employed to seal the inner manhole cover to the inner surface of the skin, after which both manhole covers are screwed together to close the manhole opening.

Thus current practice is to employ some sealing rings to seal the manhole covers against the skin of the aircraft structure that surrounds the manhole opening at issue. Currently the majority of aeronautic structures are made of composite materials, which must maintain specific behavioral specifications in the event of a lightning strike. For this reason, said sealing rings are not structural parts and are usually made of fiberglass due to the behavioral requirements they must have to be of service against lightning strikes.

As has been mentioned, these sealing rings must be able to seal the inner manhole cover with the inner surface of the skin. The surface of the sealing ring in contact with the outer skin surface of the aircraft structure has a shape in a double curve, such that it moulds itself to said surface. The opposing surface of this sealing ring is flat.

In this way, given that the positions of the manhole openings require a different shape from the inner surface of the skin, a sealing ring is required that has a different shape for each position of the manhole openings of the aircraft, because the shape of the inner surface of each ring varies and is moulded to the shape of the inner surface of the skin. Therefore, there is a very high number of differing shape designs for these sealing rings, which carries over to high production and engineering costs. Likewise, errors may occur during production and assembly of these rings, given the large diversity of parts that must be managed. Furthermore, there is no possibility of interchanging these parts, which further elevates the costs of the process.

The present invention is directed towards providing a solution to the problems described above.

SUMMARY OF THE INVENTION

Therefore, the object of the present invention is the optimization of the design of the sealing rings of the inner manhole covers which close the manhole openings over the inner skin of the structure of an aircraft.

In accordance with the invention, an optimum number of sealing ring families are generated that can be applied at the different positions of the manhole openings on the structure of an aircraft, in a way that enables a substantial reduction of the number of different parts needed to be produced and managed in a given aircraft.

Consequently, the method developed by the present invention comprises the following steps:

a) Dividing the outer contour of each sealing ring employed in each one of the manhole openings of an aircraft into n points.

b) Dividing the inner contour of each sealing ring employed in each one of the manhole openings of an aircraft into n points.

c) Measuring the distance between each one of the points n of the outer contour of step a) and the inner surface of the skin that surrounds each manhole opening.

d) Measuring the distance between each one of the points n of the inner contour of step b) and the inner surface of the skin that surrounds each manhole opening.

e) Taking the maximum and minimum values of the measurements made in step c) for the points n of each sealing ring of each of the manhole openings of the aircraft.

f) Taking the maximum and minimum values of the measurements made in step d) for the points n of each sealing ring of each of the manhole openings of the aircraft.

g) Taking the minimum value of all of the maximum values of steps e) and f) of the points n of each sealing ring of each manhole opening.

h) Taking the minimum value of all of the minimum values of steps e) and f) of the points n of each sealing ring of each manhole opening.

i) Grouping into families the different sealing rings of each manhole opening that fulfill a given requirement for the minimum values taken in steps g) and h).

j) Comparing the distance values obtained in steps c) and d) for each of the points n of each one of the sealing rings which belong to the same family grouped in accordance with step i), in such a way that the equivalent points $n_2$ and $n_3$ for each family are compared.

k) Taking the minimum measurement of each point $n_2$ of step j), in order to obtain a set of minimum values of points $n_2$ for each family for the outer contour of the sealing ring in step c) and also for the inner contour of the sealing ring in step d).

l) Generating the curves which are best adapted to the set of points taken in step k) for the outer contour of the sealing ring and for the inner contour of said sealing ring for each of the families generated in step i).

m) Generating a ruled surface between the curves generated in step l) for each one of the families generated in step i).

Other features and advantages of the present invention will be disclosed in the detailed description that follows of an exemplary, non-limiting, embodiment of its object in relation to the accompanying Figures.

BRIEF DESCRIPTION OF THE FIGURES

FIG. 5 displays a table with the distribution by families of the sealing rings of the manhole openings in accordance with the optimization method of the present invention.

DETAILED DESCRIPTION OF THE INVENTION

Figure 1:
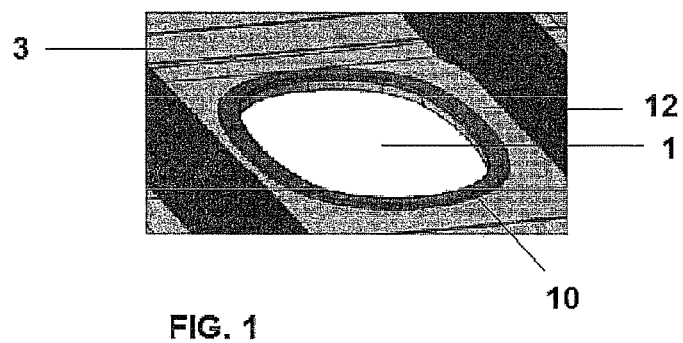
FIG. 1 displays a schematic view of the placement of a typical sealing ring in the manhole opening of an aircraft.

In accordance with the present invention, a method is disclosed for obtaining an optimization of the design of sealing rings 10 for inner manhole covers 11 that close manhole openings 12 over the inner surface 13 of the skin 20 of the structure of an aircraft. Specifically, the invention optimizes the design of the surface of the sealing rings 10 that are in contact with the inner surface 13 of skin 20 of the structure of an aircraft, which is the surface which has a double curvature, as the opposing surface of said rings 10 is flat and therefore geometrically less complex.

Figure 2:
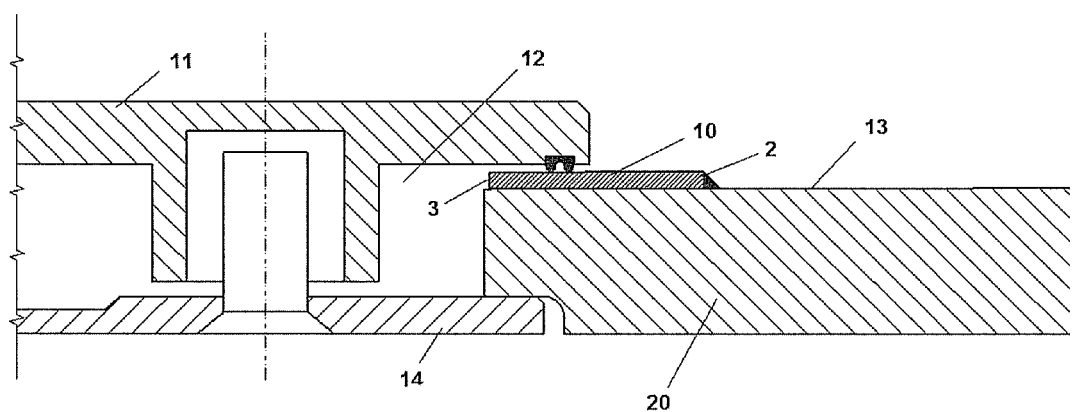
FIG. 2 displays a sectioned schematic view of the components of the seal of a typical manhole opening on an aircraft.
Figure 3:
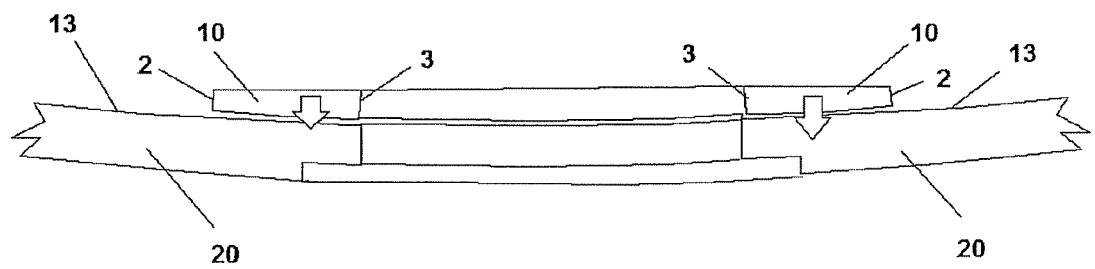
FIG. 3 displays a sectioned schematic view of the placement of the rings employed for making the seal of the inner manhole covers that close these manhole openings over the inner skin of the structure of an aircraft, the design of which is optimized in accordance with the present invention.

As can be seen in FIGS. 1 and 2, manhole openings 12 of an aircraft comprise an opening 1 having the necessary dimensions, where two manhole covers are placed, an inner manhole cover 11 located in the interior zone of the structure of the aircraft, and an outer manhole cover 14, located on the outer aerodynamic surface of the aircraft, both manhole covers 11 and 14 being screwed together (see FIG. 2) in such a way that the panel of the skin 20 of the aircraft structure is pressed between the two. Thus a sealing ring 10 is employed to seal the interior manhole cover 11 to the inner surface 13 of the skin 20, after which both manhole covers 11 and 14 are screwed together to close the manhole opening 12.

Preferably these manhole openings 12 provide access to the interior of a zone of the aircraft that comprises fuel, in particular, they provide access to a fuel tank.

Preferably, the invention is applied to aircraft structures that are made of composite material. Said sealing rings 10 are not structural parts and are usually made of fiberglass due to the behavioral requirements they must have in service against lightning strikes.

Figure 4:
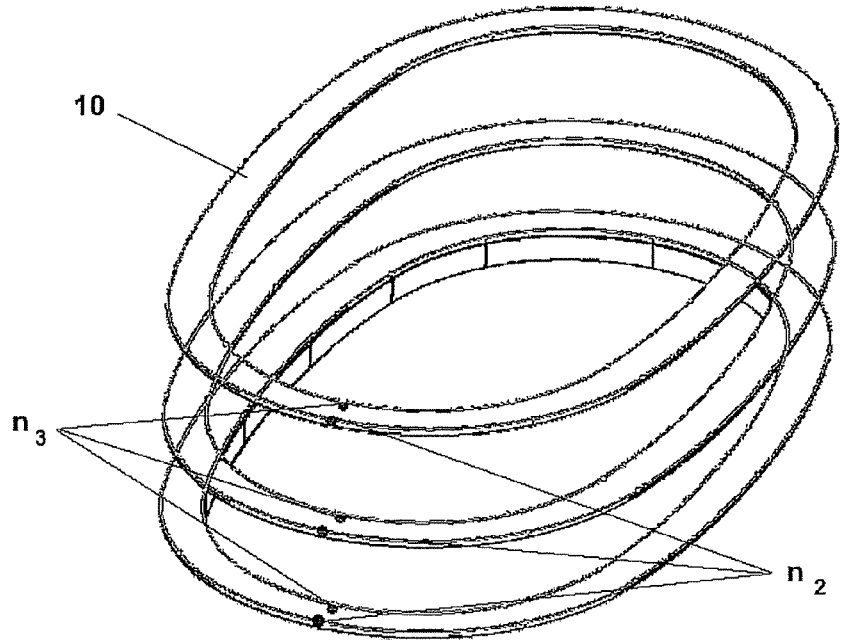
FIG. 4 displays the points ni of the different sealing rings that belong to the same family, in accordance with the optimization method of the present invention.

Defined below is the method for optimizing sealing rings 10 disclosed in the present invention, such that said method comprises the following steps:

a) Dividing the outer contour 2 of the surface in contact with the inner surface 13 of the skin 20 of each sealing ring 10 employed on each one of manhole openings 12 of an aircraft into n points (points $n_2$ in FIG. 4).

b) Dividing the inner contour 3 of the surface in contact with the inner surface 13 of the skin 20 of each sealing ring 10 employed on each one of manhole openings 12 of an aircraft into n points (points $n_3$ in FIG. 4).

c) Measuring the distance between each one of the points n of the outer contour 2 of step a) (points $n_2$) and the inner surface 13 of the skin 20 that surrounds each one of manhole openings 12.

d) Measuring the distance between each one of the points n of the inner contour 3 of step b) (points $n_3$) and the inner surface 13 of the skin 20 that surrounds each one of manhole openings 12.

e) Taking the maximum and minimum values of the measurements made in step c) for the points n of each sealing ring 10 of each one of the manhole openings 12 of the aircraft (points $n_2$).

f) Taking the maximum and minimum values of the measurements made in step d) for the points n of each sealing ring 10 of each one of the manhole openings 12 of the aircraft (points $n_3$).

g) Taking the minimum value of all of the maximum values of steps e) and f) for the points n of each sealing ring 10 of each manhole opening 12.

h) Taking the minimum value of all of the minimum values of steps e) and f) of the the n points of each sealing ring 10 of each manhole opening 12.

i) Grouping into families $F_i$ the sealing rings 10 of each manhole opening 12 that fulfill a given requirement for the minimum values taken in steps g) and h).

j) Comparing the distance values obtained in steps c) and d) for each one of the n points of each one of the sealing rings 10 which belong to the same family $F_i$ in accordance with step i), in such a way that the equivalent $n_2$ and $n_3$; points are compared for each family $F_i$.

k) Taking the minimum measurement of each point $n_i$ of step j), in order to obtain a set of minimum values for the points ni of each family $F_i$ for the outer contour 2 of the sealing ring 10 in c), that is, of points $n_2$, and also for the inner contour 3 of the sealing ring 10 in d), that is, points $n_3$.

l) Generating the curves which are best adapted to the set of points taken in step k) for the outer contour 2 of the sealing ring 10 (points $n_2$) and for the internal contour 3 of said sealing ring 10 (points $n_3$) for each of the families generated in step i).

m) Generating a ruled surface between the curves created in step l) for each one of families $F_i$ generated in step i)

In step i) the requirement customarily employed for forming the groupings by families $F_i$ of the different sealing rings 10 of each manhole opening 12, is that the minimum values obtained both in step g) and in step h) for sealing rings 10 of the same family $F_i$, should not differ from each other by more than a given value, which represents the maximum permissible deviation allowed in the design that can be filled with a sealing material fulfilling safety requirements.

In steps a) and j) of the described method it must be taken into account that the points n of the outer contour 2 of the surface in contact with the inner surface 13 of the skin 20 of each sealing ring 10 (points $n_2$), as well as the points n of the inner contour 3 of the surface in contact with the inner surface 13 of the skin 20 of each sealing ring 10 (points $n_3$) must be generated in an ordered manner, such that point ni of outer contour 2 of a sealing ring 10 (point $n_2$) is placed in a similar position on each and every one of the different sealing rings 10 which are being utilized. In like manner, each point ni of inner contour 3 of a sealing ring 10 (point $n_3$) must be placed in a similar position on each and every one of the different sealing rings 10 which are being utilized. In this way, if rings 10 were stacked one on top of the other, these points ni (points $n_2$ and $n_3$), would be superimposed on each other, as can be seen from FIG. 4, attached.

Typically, the number n of points employed in steps a) and b) are between 50 and 100, so as to obtain a number of families $F_i$ of the different sealing rings 10 of each manhole opening 12 that is sufficiently different from the number of manhole openings 12 found on the aircraft.

Preferably, the generation of the curves in step l) of the method is done by a computer with a computer aided design program.

In a similar way, it is also preferable to generate the ruled surface in step m) from the curves generated in step, l) using a computer with a computer aided design program.

The ruled surface generated in step m) of the method will shape the bottom face of the sealing ring 10 which will be in contact with the inner surface 13 of the skin 20 in the different manhole opening 12 positions while fulfilling several requirements:

To have the capacity to absorb a deviation of the thickness of the skin 20 in compliance with the tolerance indicated in the manufacturing requirements To ensure a minimum thickness of the skin 20 below which the use of the sealing ring 10 would not be recommended as the existence of a sufficiently big support surface would not be guaranteed.

To ensure that the deviation between the ruled surface of the sealing ring 10 and the different inner surfaces 13 of the skin 20 of each manhole opening 12 found in the same family $F_i$ cannot exceed the maximum permissible thickness of the sealant.

Thus, the main advantages obtained with the method of optimization described in the invention are the following:

Reduction of the number of different sealing rings that are handled for the different manhole openings 12 of an aircraft, which reduces the design work, which in turn improves the efficient use of the time needed by the different departments involved in the design, calculation and production of these components.

The production process of sealing rings 10 is greatly expedited because the ruled surfaces of the same are more easily machined.

The production costs of these sealing rings 10 are greatly reduced.

A limited number, typically three, of basic laminates made of composite materials having different widths is defined for producing sealing rings 10 for the structure of the aircraft, which results in important savings in time and material.

Fewer tools are required for production and assembly.

By reducing the diversity of parts to be assembled, it is harder for mistakes to occur during installation.

The method of the invention is applicable in subsequent variants of the aircraft, to any structure or piece that has a high repetitiveness of shapes or dimensions that may resemble each other.

Although the present invention has been disclosed entirely in connection with the preferred embodiments, it is obvious that those modifications may be introduced that are within its scope, which should not be considered limited by the previous embodiments, but rather by the content of the following claims.

The invention claimed is:

1. A method for optimizing a design of sealing rings of internal manhole covers which close manhole openings over an inner surface of a skin of an aircraft structure, a surface of the sealing ring which is in contact with the inner surface of the skin being an optimized surface of the sealing rings and the sealing rings being separate and distinct pieces from the manhole covers and the skin of the aircraft, the method comprising:
   a) dividing an outer contour of each sealing ring of a plurality of sealing rings employed in each one of the manhole openings of the aircraft structure into n points;
   b) dividing an inner contour of each sealing ring of a plurality of sealing rings employed in each one of the manhole openings of the aircraft structure into n points;
   c) determining a distance between each one of the n points of the outer contour of each of the plurality of sealing rings from step a) and the inner surface of the skin that surrounds each manhole opening;
   d) determining a distance between each one of the n points of the inner contour of each of the plurality of sealing rings from step b) and the inner surface of the skin that surrounds each manhole opening;
   e) grouping the sealing rings into families $F_i$, wherein each of the families $F_i$ of sealing rings is compatible with more than one of the manhole openings of the aircraft structure;
   f) taking a minimum distance value determined for each point $n_i$ of each family $F_i$ for the outer contour of each sealing ring in step c), and also for the inner contour of each sealing ring in step d);
   g) generating curves according to the points taken in step f) for the outer contour and for the inner contour of each sealing ring for each one of the families generated in step e);
   h) generating a ruled surface among the curves generated in step g) for each one of the families $F_i$ generated in step e); and
   i) manufacturing optimized sealing rings for each of the families $F_i$, each of the optimized sealing rings having a bottom surface in a shape of the ruled surface generated in step h).

2. The method of claim 1, wherein the method comprises, after step d):
   d1) taking maximum and minimum distance values from the distances determined in step c) at each of the n points of each sealing ring of each of the manhole openings of the aircraft;
   d2) taking maximum and minimum distance values from the distances determined in step d) at each of the n points of each sealing ring of each of the manhole openings of the aircraft;
   d3) taking a minimum distance value of all of the maximum distance values from steps d1) and d2) at each of the points n of each sealing ring of each of the manhole openings of the aircraft; and d4) taking a minimum distance value of all of the minimum distance values from steps d1) and d2) at each of the points n of each sealing ring of each of the manhole openings of the aircraft.

3. The method of claim 2, wherein:

the groupings by families $F_i$ in step e) are done based on a given requirement that must be fulfilled by the minimum distance values obtained both in step d3) and step d4) for the sealing rings of same family $F_i$; and the minimum values of steps d3) and d4) for the sealing rings of the same family $F_i$, differ from each other by no more than a value which represents a maximum permissible deviation of the design that can be filled with a sealing material fulfilling safety requirements.

4. The method of claim 1, comprising, after step e):

e1) comparing the distances determined in steps c) and d) for each one of the n points of each one of the sealing rings which belong to a same family $F_i$ according to step e), such that equivalent points $n_2$ and $n_3$ are compared for each family $F_i$.

5. The method of claim 4, comprising, after step e1):

e2) taking a minimum measured value of each point $n_i$ from step e1), to obtain a set of minimum values of points $n_i$ for each family $F_i$ for the outer contour of each sealing ring in step c) and also for each inner contour of the sealing ring in step d).

6. The method of claim 4, wherein, in steps a) and e1), the points n of the outer contour of the surface of each sealing ring closest to the inner surface of the skin and the points n of the inner contour of the surface of each sealing ring closest to the inner surface of the skin are generated such that point $n_i$ of the outer contour of a sealing ring is placed in a similar position on each of the different sealing rings which are being utilized and, furthermore, each point $n_i$ of the inner contour of a sealing ring is placed in a similar position on each of the different sealing rings which are being utilized.

7. The method of claim 1, wherein the curves are generated in step g) using a computer with a computer aided design program.

8. The method of claim 1, wherein the ruled surfaces are generated in step h) using a computer with a computer aided design program.

9. The method of claim 1, wherein the aircraft structures comprise a composite material and/or the sealing rings comprise fiberglass.

* * * * *